United States Patent [19]
Cline

[11] Patent Number: 4,527,082
[45] Date of Patent: Jul. 2, 1985

[54] SURFACE ACOUSTIC WAVE DEVICE FROM EUTECTIC DEPOSIT

[75] Inventor: Harvey E. Cline, Schenectady, N.Y.

[73] Assignee: General Electric Company, Schenectady, N.Y.

[21] Appl. No.: 531,514

[22] Filed: Sep. 12, 1983

Related U.S. Application Data

[62] Division of Ser. No. 395,778, Jul. 6, 1982.

[51] Int. Cl.³ .............................................. H03H 9/25
[52] U.S. Cl. .................................. 310/313 B; 427/100; 430/945
[58] Field of Search .................... 310/313 B, 313 A; 430/945; 427/100

[56] References Cited

U.S. PATENT DOCUMENTS 4,414,243  11/1983  Cline ................................. 427/100
4,450,374   5/1984  Cho et al. ....................... 310/313 B Primary Examiner—Peter S. Wong
Assistant Examiner—D. L. Rebsch
Attorney, Agent, or Firm—Paul E. Rochford; James C. Davis, Jr.; James Magee, Jr.

[57] ABSTRACT

A method for the fabrication of surface acoustic wave devices by the selective removal of one of the phases of a metallic eutectic, solidified as a thin film having a lamellar morphology, forms a first spaced array of metallic elements. Removal is by line-heater or laser beam. This then provides a self-aligned structure for the formation of a second array of metallic elements interdigitated with the elements of the first array.

5 Claims, 12 Drawing Figures

U.S. Patent  Jul. 2, 1985  Sheet 1 of 4  4,527,082
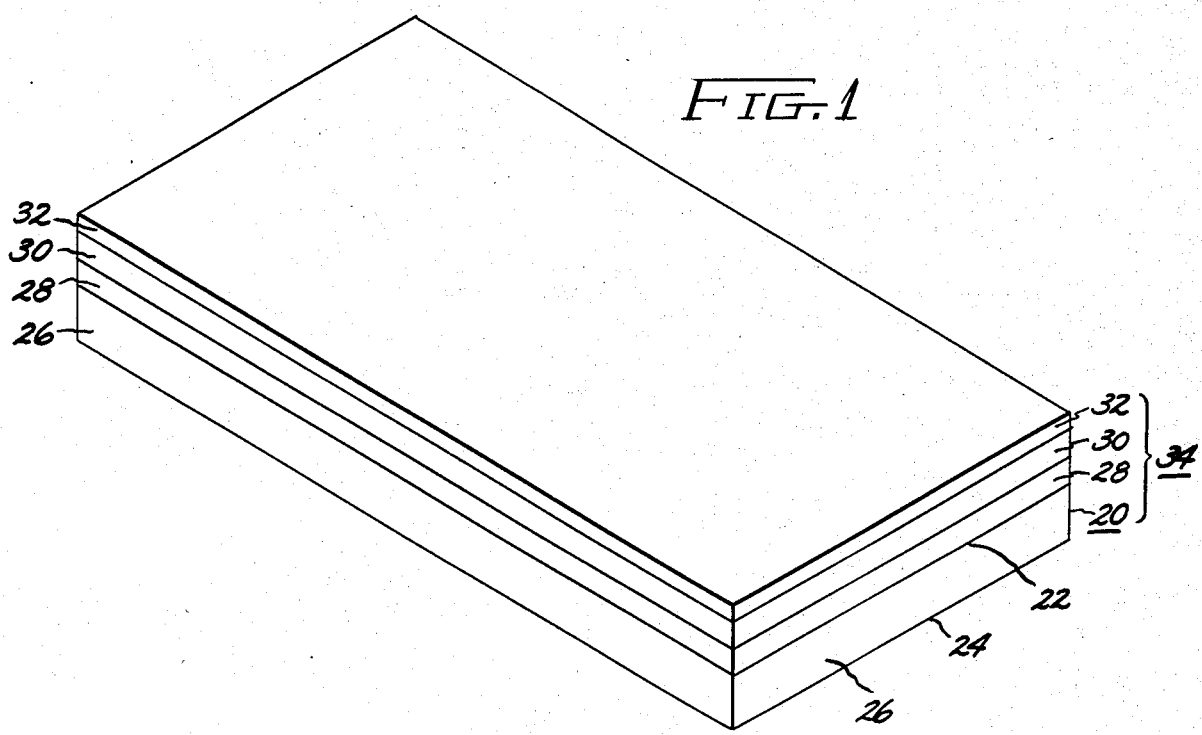
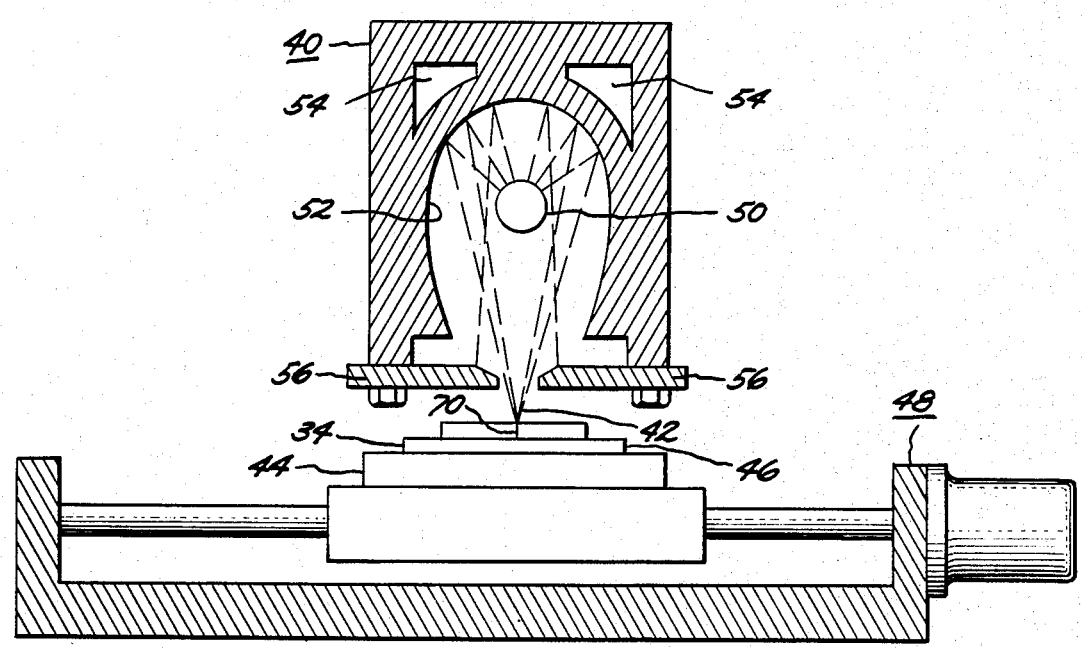

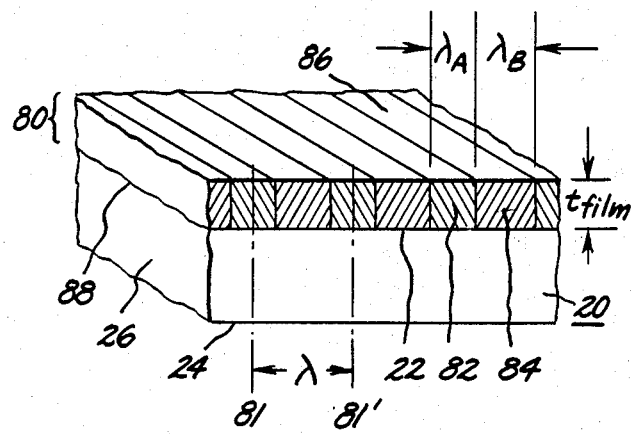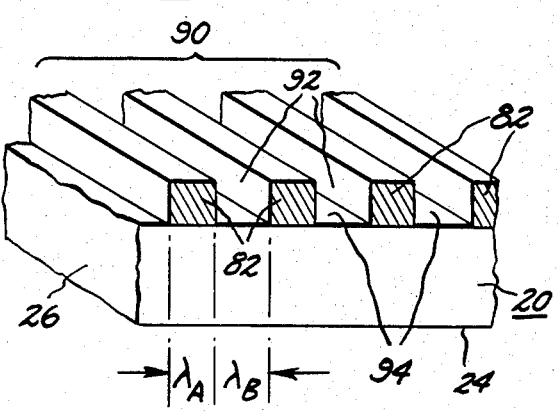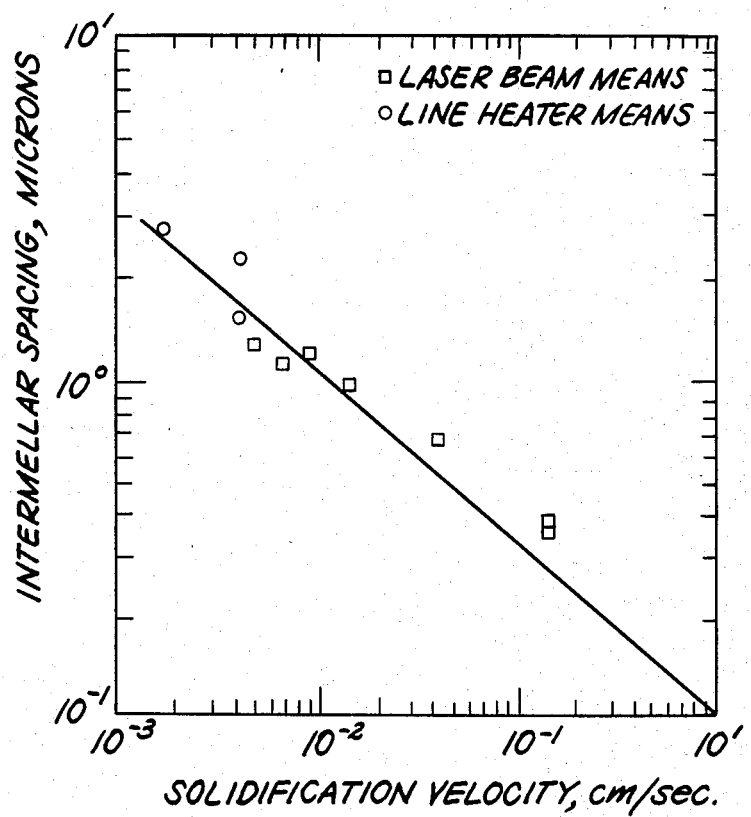

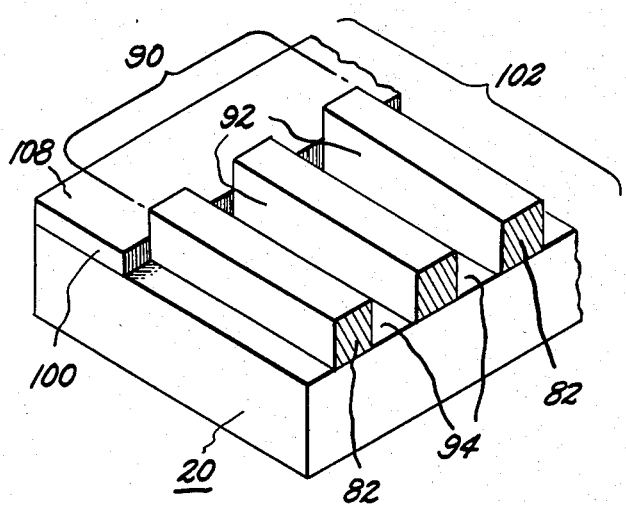
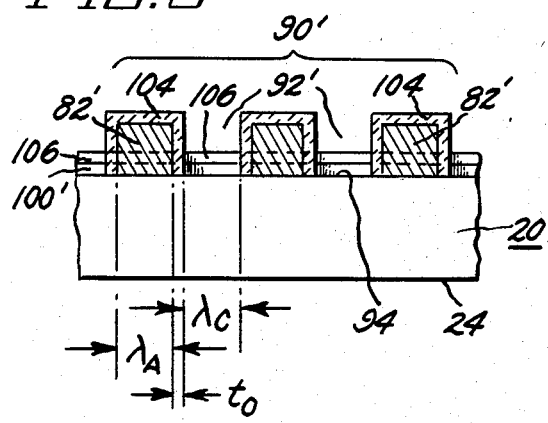
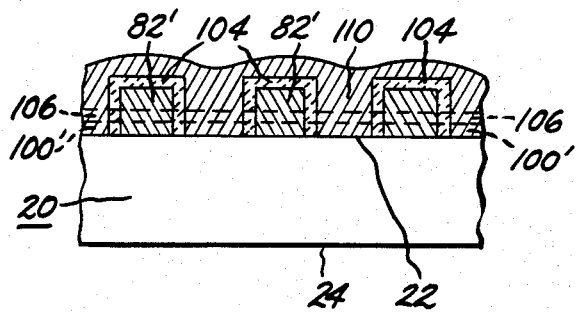
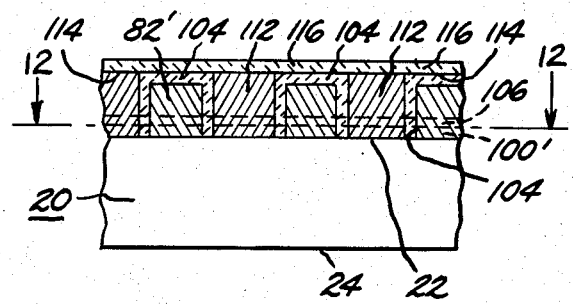
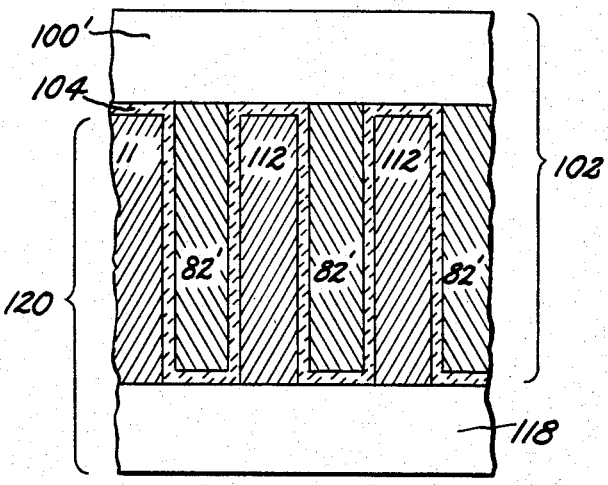

SURFACE ACOUSTIC WAVE DEVICE FROM EUTECTIC DEPOSIT

CROSS-REFERENCE TO RELATED APPLICATIONS

This application is a division of application Ser. No. 395,778, filed July 6, 1982.

The invention herein is related to the inventions disclosed and claimed in U.S. patent application Ser. Nos. 245,764, 253,985, 320,995, 382,878, and 395,761 which were filed Mar. 20, 1981, Apr. 13, 1981, Nov. 13, 1981, May 28, 1982 and July 6, 1982, now U.S. Pat. Nos. 4,500,609, 4,349,621, 4,477,324, 4,461,070, and 4,500,898, respectively; all of which were filed in the name of the inventor of the invention herein, are assigned to the same assignee as the instant invention, and are herein incorporated by reference.

INTRODUCTION

This invention relates generally to surface acoustic wave devices and, more particularly, to surface acoustic wave devices made by the method of the invention wherein a first spaced array of metallic elements is made by the selective removal of one of the phases of a metallic eutectic solidified as a thin film having a lamellar morphology, which then provides a self-aligned structure for the formation of a second array of metallic elements interdigitated with the elements of the first array.

BACKGROUND OF THE INVENTION

Surface acoustic wave (SAW) devices generally consist of two or more transducers formed from interlocking (interdigitated) comb-like arrays of elements in contact with a piezoelectric material. At high frequencies, these piezoelectric devices are capable of providing a considerable reduction in the size, complexity and power consumption of certain components and subsystems, such as filters and oscillators, used in modern communications and radar systems. By decreasing the widths of the elements and the inter-element spacing in the arrays of elements that form the transducers that generate and/or detect the surface acoustic waves in the piezoelectric material from about 1 micron to about 0.1 micron, the operable frequency range may be increased from about 1 GHz to about 10 GHz.

Presently, the elements of surface acoustic wave devices are made by conventional photolithographic, chemical etching and metallization techniques. Photolithographic techniques are economically and technically capable of commercially producing elements as small as about 1 micron in width. In order to achieve sub-micron widths and thereby decrease size and increase operating frequency, resort must generally be made to pioneering electron beam and X-ray lithographic techniques. At the present time, these pioneering techniques are slower and more expensive, especially in terms of capital equipment costs, than the more conventional photolithographic techniques.

Thus, there is a need for surface acoustic wave devices having near-micron and sub-micron sized component parts and features, i.e., elements and inter-element spacing, and for methods by which those near-micron and sub-micron sized features can be produced reproducibly and inexpensively.

SUMMARY OF THE INVENTION

In accordance with the method of the present invention, it is possible to avoid in large measure the aforementioned limitations and drawbacks of the lithographic processes in the manufacture of surface acoustic wave devices. More particularly, the present invention inexpensively provides interdigitated structures of highly desirable metallic elements having micron and sub-micron width and inter-element spacing heretofore generally attainable only by means of slow and expensive electron-beam lithographic processes and the like. The interdigitated structures are self-aligning, thus the expensive and time consuming alignment steps of conventional lithographic processes are largely eliminated. Further, in sharp contrast to present-day electron beam equipment operating in the direct writing mode, the speed of the process of the invention increases as the structures become finer.

Briefly, the method of the invention includes the steps of: providing a body or substrate suitable for the manufacture of surface acoustic wave devices; forming a thin film lamellar metallic eutectic on the substrate; selectively removing one of the phases of the thin film lamellar metallic eutectic to form a first spaced array of substantially parallel metallic lamellae or elements of the remaining phase; forming a first interconnect to electrically connect the elements of the first spaced array, forming a first comb-like structure; applying a layer of an insulating material over the exposed surfaces of the first comb-like structure, i.e., over the exposed surfaces of the elements of the first spaced array and the exposed surfaces of the interconnect; selectively depositing a substantially continuous layer of a conducting material over the insulated metallic elements of the first spaced array and into the spaces between the insulated elements of the first spaced array; preferentially removing segments of the deposited conducting material from above the insulated metallic elements of the first array to form a second spaced array of metallic elements substantially juxtaposed from the insulated metallic elements of the first array; and forming a second interconnect to electrically connect the metallic elements of the second spaced array, forming thereby a second comb-like structure interdigitated with and electrically insulated from the first comb-like structure.

BRIEF DESCRIPTION OF THE DRAWINGS

FIG. 1 is a schematic dimensional representation of a preform consisting of a body of single crystal piezoelectric material, two planar layers of the two components of a binary eutectic system overlying a major surface of the body and an optional cover layer overlying the eutectic components;

FIG. 2 is a schematic representation in cross-section of an apparatus, including a line heater, used to form a thin film eutectic on the body of FIG. 1;

FIG. 5 is a schematic dimensional view in partial cross-section of a thin film lamellar eutectic situated on a major planar surface of a body;

FIG. 6 is a schematic dimensional representation of the structure of FIG. 5 following selective removal of one of the phases to form a first spaced array of metallic elements of the remaining phase;

FIG. 7 is a graph of the interlamellar spacing of thin films of the Al-CuAl$_2$ eutectic system as a function of solidification velocity;

FIG. 8 is a schematic dimensional view in partial cross-section of the first spaced array of FIG. 6 following formation of a first interconnect to electrically connect the metallic elements of the first spaced array and to form a first comb-like structure;

FIG. 9 shows schematically a front view in cross-section of the structure of FIG. 8 following formation of a layer of an insulating material over the exposed surfaces of the first comb-like structure;

FIG. 10 shows schematically the structure of FIG. 9 following deposition of a substantially continuous layer of a conducting material over the insulated first comb-like structure and into the spaces between the insulated elements of the first spaced array;

FIG. 11 shows schematically the structure of FIG. 10 following preferential removal of segments of the substantially continuous layer of a conducting material from above the insulated metallic elements of the first array to form a second spaced array of metallic elements substantially juxtaposed from the insulated metallic elements of the first array; and FIG. 12 shows a schematic top view of the structure of FIG. 11 following formation of a second interconnect to electrically connect the metallic elements of the second spaced array to form a second comb-like structure interdigitated with and electrically insulated from the first comb-like structure typical of surface acoustic wave devices.

DETAILED DESCRIPTION OF THE INVENTION

Figure 3:
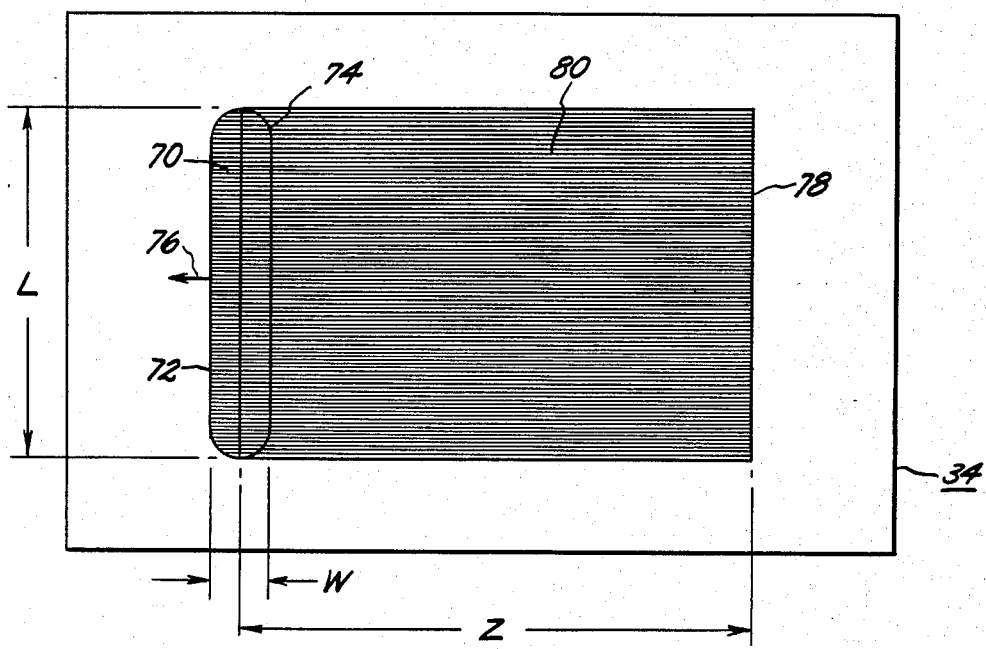
FIG. 3 is a schematic representation of the top surface of the preform of FIG. 1 partially converted to a thin film lamellar eutectic.

Reference is made to FIG. 1, where there is shown a body of oriented single crystal piezoelectric material 20 suitable for illustrating the basic innovative concept herein described of a method for producing interdigitated surface acoustic wave (SAW) devices. Geometrically, body 20 may be described in terms of substantially parallel planar surfaces 22 or 24, i.e., top (or upper) and bottom (or lower) surfaces, respectively, for the orientation of body 20 shown in FIG. 1, and peripheral edge area 26, which interconnects surfaces 22 and 24. Edge area 26 may be of any convenient shape.

The material of body 20 is piezoelectric, i.e., is one that exhibits a displacement of electrical charge on the application of an external strain. In piezoelectric materials the effect is reversible, i.e., the application of an electric charge or field to the piezoelectric crystal causes an elastic strain, and the strain is directly proportional to the field. Typical piezoelectric materials useful in the practice of the instant invention include quartz and the semiconductor gallium arsenide (GaAs). Alternatively, body 20 may be of an insulating material such as sapphire and the piezoelectric material may be applied over the completed interdigitated arrays as a thin film of a piezoelectric material such as zinc oxide.

In the practice of the present invention, a eutectic alloy is solidified as a thin film on at least a portion of either major planar surface 22 or 24 as described below in brief, but functional, detail and in greater detail in the above cross-referenced and incorporated Ser. No. 245,764 application and the paper "Directionally Solidified Thin-Film Eutectic Alloys" by H. E. Cline (Journal of Applied Physics, 52 (1), pp. 256–260, January 1981) which is also incorporated by reference. The eutectic alloy selected is one which can be solidified to form a lamellar structure, i.e., one having alternating plate-like regions whose compositions correspond substantially to the phases of the eutectic system. Although the present invention is not limited to the use of binary eutectic systems, i.e., the inventive concept is equally applicable to ternary and higher order eutectics, typical suitable binary metallic systems include, for example, the lead-tin, lead-cadmium and aluminum-copper systems. If subsequent device processing steps include processing at high temperatures, the refractory metal-based metallic eutectic systems such as the chrome-silicon and molybdenum-silicon systems are also useable and desirable.

The thicknesses of the materials, i.e., components, of the eutectic alloy system are calculated per unit area of surface 22 or 24 as a ratio according to the following formula:

$$t_1 \rho_1 W_1 = t_2 \rho_2 W_2 = \ldots = t_n \rho_n W_n \tag{1}$$

where
- $W_1$ = weight percent of component 1 in the eutectic
- $W_n$ = weight percent of the $n^{th}$ component in the eutectic
- $\rho_1$ = density of component 1
- $\rho_n$ = density of the $n^{th}$ component
- $t_1$ = thickness of the layer of component 1
- $t_n$ = thickness of the layer of the $n^{th}$ component and converted to actual thicknesses by use of the formula $$t_{film} = t_{total} = t_1 + t_2 + \ldots + t_n \tag{2}$$

For a binary system, equation (1) reduces to $$\frac{t_1}{t_2} = \frac{\rho_2 W_1}{\rho_1 (1 - W_1)} \tag{3}$$

The calculational method shown above is more accurate than calculations from the phase diagram based on the so-called lever rule and is, therefore, preferred.

The starting materials should be as pure as possible, preferably "4-9s" or purer, as impurities tend to disrupt the heat and mass balance of the solidifying eutectic during the subsequent processing described below, forming defects, e.g., faults. Contamination of body 20 and the materials of the eutectic is to be avoided, thus the practice of clean room conditions, such as are known to those skilled in the art of the manufacture of semiconductor devices, is preferable.

The eutectic materials and body 20 are transferred to suitable apparatus (not shown) for the evaporation and deposition of the eutectic materials onto body 20. In a vacuum, preferably less than or equal to $10^{-6}$ Torr, the materials of the eutectic are evaporated and deposited sequentially in overlying planar layer-like fashion onto body 20. In FIG. 1 there is shown schematically layer 28 of a first component of a binary eutectic system deposited upon surface 22 of body 20 and layer 30 of the second component deposited upon layer 28. Preferably, the thickness of each layer is within ±10% of that calculated with Equations (1) and (2), although for some eutectic systems the acceptable tolerance may be less than ±10% in order to obtain the desired lamellar structure.

Optionally, cover layer 32, as shown in FIG. 1, may be provided on top of the deposited eutectic components. Cover layer 32 may be provided by depositing a refractory metal oxide subsequent to the deposition of the layers of the eutectic material or may be another piece of the same material as body 20 laid upon the deposited components. Cover layer 32 is desirable to prevent oxidation of the eutectic during subsequent processing. Oxidation may also be avoided by practicing the invention in a vacuum or inert atmosphere. With or without cover layer 32, a completed preform 34 has been fabricated at this stage.

The prepared eutectic preform 34 is next placed in an apparatus, such as that shown schematically in FIG. 2, for the next steps in the preparation of the eutectic thin film. Typically, the apparatus of FIG. 2 consists of heat source 40 capable of projecting a beam of heat 42 onto preform 34, heat sink 44, which may be water cooled, optional thermal buffer plate 46 of a material such as quartz, and means 48 for smoothly translating heat sink 44 and preform 34 mounted thereon beneath beam 42 at a determinable rate. Sufficient heat is applied from heat source 40 to form narrow molten zone 70 of width W and longitudinal length L, as shown in FIG. 2 and in greater detail in FIGS. 3 and 4.

A line heater, such as that shown in FIG. 2, has been found to be an effective heat source 40 with suitable modifications including a line voltage regulator to minimize power fluctuations. One such line heater is that manufactured by Research, Inc. of Minneapolis, Minn. (Catalogue #5215-10). The line heater of FIG. 2 consists primarily of lamp 50, such as a quartz-iodine or arc lamp, situate at the focal point of a polished aluminum elliptical reflector 52 which has cooling channels 54 therein. The commercial line heater was further modified by shutters 56 of highly polished aluminum which effectively intensifies the thermal profile of beam 42 thus narrowing the width of zone 70 thereby increasing the thermal gradient in zone 70.

A laser is also a suitable, although more expensive, heat source 40 than the line heater. The narrower molten zone 70 created by a laser makes possible both higher thermal gradients in molten zone 70 and more rapid solidification rates and, consequently, eutectic thin films having narrower lamellae and smaller interlamellar spacings. Replacement of the line heater with a laser as heat source 40 requires means for spreading the circular beam into a linear (line) heat source. The use of optics to slowly scan or raster the laser beam across preform 34 has been found to result in objectionable surface perturbations. A simple non-mechanical solution is to provide a cylindrical lens in the path of the laser beam between the laser as heat source 40 and preform 34 to convert the circular beam into a thin line source of heat. If was found, however, that the beam intensity was not uniform along the length of the line when the lens system was used, i.e., there was a decrease in power at the end compared to the center of the line of heat.

The laser beam may be scanned rapidly enough through the use of a lens-mirror system, such as a rotating polygonal mirror, to create a satisfactory line source of heat. A further advantage of the use of a laser as heat source 40 is that preform 34 may be kept statutory and molten zone 70 traversed across preform 34 by the use of additional optical scanning means. By keeping preform 34 stationary, it is possible to minimize disruption of the eutectic structure by external mechanical vibrations. The use of the rotating polygonal mirror, however, adds to the overall cost of the system and requires that the optical system be kept in perfect alignment.

Figure 4:
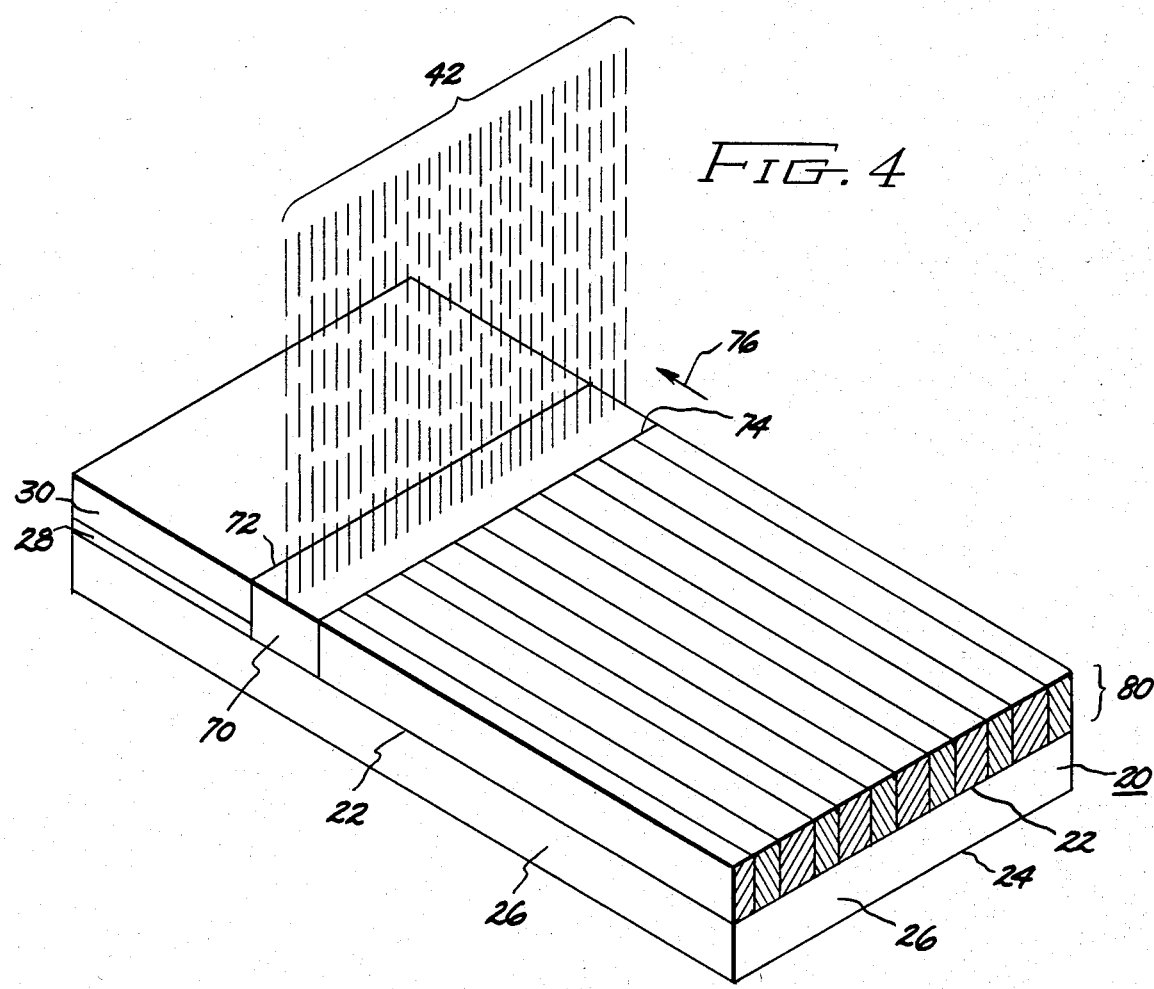
FIG. 4 is a dimensional view of the preform of FIG. 1 undergoing processing to form a thin film lamellar eutectic.

As shown in FIG. 4, molten zone 70 will be coextensive with and will rest on at least a portion of planar surface 22 (or 24) of body 20 and will otherwise be bounded by the unmelted eutectic material layers 28 and 30 and solidified thin film eutectic 80. By operating means 48, preform 34 is traversed beneath the stationary heat source, in effect, moving molten zone 70 across preform 34. As molten zone 70 traverses preform 34, component layers 28 and 30 of the eutectic are melted at leading edge 72 of zone 70, mixed together in zone 70, and solidified at trailing edge 74 of zone 70 in the desired eutectic pattern 80. After the desired amount of material has been melted and solidified, the traversing motion of means 48 is stopped and heat source 40 is turned off whereupon molten zone 70 freezes in situ. In FIG. 3, molten zone 70 is shown after traversing a distance Z, in the direction of arrow 76 from starting location 78.

FIG. 5 is a schematic cross-sectional representation of the structure of solidified eutectic 80 and is typical of the two phase thin film lamellar metallic eutectics made by the method described above. The interlamellar spacing, $\lambda$, is defined as the distance between a reference point on one lamella to the corresponding reference point on the nearest adjacent lamella of the same type, e.g., centerlines 81 and 81' shown in FIG. 5. Also shown in FIG. 5 are the widths $\lambda_A$ and $\lambda_B$ of lamella 82 and 84, respectively. The lamellae extend between and terminate in the substantially parallel and generally planar top 86 and bottom 88 surfaces of thin film eutectic 30. In this case, bottom surface 88 of thin film 80 will be coextensive with at least a portion of surface 22 of body 20. The centerlines of the lamellae, e.g., centerlines 81 and 81', are substantially parallel to the film thickness dimension, i.e., the lamellae intersect top 86 and bottom 88 surfaces of the thin film at substantially right angles. The resultant film thickness, $t_{film}$, is measured as the perpendicular distance between surfaces 86 and 88 and is generally equal to the sum of the thicknesses of the component layers, e.g., layers 28 and 30. The interlamellar spacing, $\lambda$, and, consequently, the widths of the lamellae are principally a function of the growth, i.e., solidification, rate which generally follows the empirical relationship $$\lambda^2 V = \text{constant} \tag{4}$$

where V equals the growth rate. Generally, the growth rate is equal to the rate at which molten zone 70 is traversed across preform 34.

Next, in accordance with the teachings of the above cross-referenced Ser. No. 320,995 application, one of the phases of the solidified thin film eutectic is selectively removed. Suitable means include chemical dissolution, electrochemical dissolution and reactive ion etching (plasma etching). As shown in FIG. 6, the product of this step is first spaced array 90 of substantially parallel lamellae or metallic elements 82 of the remaining phase with substantially parallel spaces 92 in-between lamellae 82. Substantially parallel spaces 92 expose surfaces 94 of surface 22 of body 20. A particularly desirable feature of array 90 is that the width of lamellae 82 ($\lambda_A$) and the spacing ($\lambda_B$) of spaces 92 in-between lamellae 82 can readily be achieved at near-micron and submicron levels without resort to the slow and expensive prior art electron beam and X-ray lithographic processes required to otherwise produce such structures as array 90. In the case of a ternary eutectic, for example, where one phase is removed selectively, the "remaining lamellae 82" would be a coupled pair of the two phases not removed.

FIG. 7 shows data of interlamellar spacing as a function of the solidification velocity for several preforms of the Al-CuAl$_2$ eutectic alloy system (33.2 wt.% Cu) solidified on a Pyrex ® substrate using line heater and laser beam means. The preforms were made by depositing layers of Cu and Al on the Pyrex ® substrate with an electron beam evaporator in a vacuum of $10^{-6}$ Torr at a rate of 20 Angstroms/sec. During evaporation, the thicknesses of the layers were monitored to give a 2580 Å thick copper layer and a 17,420 Å thick aluminum layer. These thicknesses were calculated by equation (3) to give a 2 micron thick thin film of the eutectic composition.

The CuAl$_2$ phase ($\theta$) was selectively removed by electropolishing the films in a Disa Electropol Type 53 apparatus in a flowing solution of 62 ml perchloric acid, 137 ml water, 700 ml ethanol, and 100 ml butylcellosolve. The electropolishing process was conducted at 35 volts direct current (DC) for 4 seconds at room temperature with the thin film as the anode and a stainless steel cathode of approximately the same surface area as the film situated opposite the thin film and separated by about 10 mm from the film.

The widths of the remaining lamellae of the aluminum-rich phase ($\alpha$) and spacing between the remaining lamellae were measured in a scanning electron microscope. Since the width of the $\alpha$-phase was essentially equal to the width of the $\theta$ phase, the remaining $\alpha$-phase wires were about one-half of the interlamellar spacing plotted in FIG. 7. Thus, for the preform solidified at 0.0016 cm/sec having an interlamellar spacing of about 2.4 microns, the width of the remaining lamellae of the $\alpha$-phase was about 1.2 microns. For the preform solidified at 0.14 cm/sec having an interlamellar spacing of about 0.33 micron the width of the remaining lamellae of the $\alpha$-phase was about 0.16 micron. In all case, the height of the remaining lamellae was about 2 microns above surface 22. The data of FIG. 7 are described by the equation $$\lambda = B(V)^{-\frac{1}{2}} \quad (5)$$

where the constant $B = 8.4 \times 10^{-6}$ cm$^{3/2}$sec$^{-\frac{1}{2}}$. The scatter in the interlamellar spacing is attributed to local fluctuations in the solidification velocity or in the constancy of the heat flow.

Transmission electron microscopy of the as-solidified eutectic thin films demonstrated that the interphase boundary between the Al-rich ($\alpha$) phase and the CuAl$_2$ ($\theta$) phase was planar and oriented normal to the plane of the film. Selective area electron diffraction was used to identify the phases and showed that the remaining lamellae were single crystals. Single crystals are advantageous for use in device manufacture at submicron dimensions since single crystals exhibit minimal electromigration and improved thermal stability compared to polycrystals at the high temperatures which may be encountered in subsequent processing operations.

Using the same general procedure and equipment described above, a 5320 Å thick layer of cadmium and a 15,680 Å thick layer of lead were sequentially deposited on a Pyrex ® substrate in a vacuum of $10^{-6}$ Torr and directionally solidified at 0.0042 cm/sec.

The resultant lead-cadmium lamellar eutectic (17.4 wt.% Cd) thin film was electropolished using the pump from the Disa apparatus to pump a solution of 1% perchloric acid in methanol through a hypodermic syringe. The needle of the syringe, as the cathode, was traversed back and forth across a selected area of the anodic thin film at a distance of about 4 cm at a direct current potential of about 150 volts between the two. The structure was observed periodically through a microscope and the electropolishing was continued until the lamellae of the cadmium-rich phase were removed from between the lamellae of the lead-rich phase in the selected area. The result was a spaced array of lead-rich lamellae about 0.42 micron wide having an interlamellar spacing of about 0.57 micron. Alternatively, it has been found that dissolution of the lamellae of the cadmium-rich phase can be accomplished by simple immersion in a 1% solution of Nital (1 ml HNO$_3$ in 99 ml ethyl alcohol).

Next, lamellae 82 (also referred to as "elements" or "fingers") of array 90 are physically and electrically interconnected at one end only by means of interconnecting metallic stripe or bus 100 shown in FIG. 8, to form first comb-like structure 102. Interconnect 100 is fabricated by conventional photomasking, chemical etching and metallic deposition techniques. The next step in the method of the instant invention is to apply a layer of an insulating material 104 over the exposed surfaces of first comb-like structure 102, i.e., over the exposed surfaces of lamellae 82 and the exposed surfaces of metallic stripe 100 as shown in FIG. 9. This step is preferably accomplished by anodic oxidation. The end result of this step is seen from FIG. 9 to be first insulated comb-like structure 102' consisting of spaced array 90' of insulated elements 82', with spaces 92' in-between, and insulated interconnect 100'.

If an ideal quarter-wavelength device is to be constructed, the eutectic will have been selected such that the ratio of $\lambda_B$ (inter-element spacing created by the removed phase) to $\lambda_A$ (element width) is about 4:1. Thus, the oxide thickness, $t_o$, in space 92 will be adjusted such that $\lambda_C$ (the width of the elements of the second array yet to be formed) plus $2t_o$ equals $\lambda_B$, i.e., the widths $\lambda_A$ and $\lambda_C$ of the elements and the widths, $t_o$, of the oxide layers in-between the elements will all be equal. In structures other than those having quarter-wavelength spacing, the width, $t_o$, of insulating layer 104 in spaces 92 is adjusted to make spacing $\lambda_C$ substantially equal to the width, $\lambda_A$, of elements 82.

In preparation for the next step, layer 106 of a patterned masking material such as photoresist is selectively applied to top surface 108 of interconnect 100. Then, a conducting material such as copper, chromium or molybdenum or alloys thereof is deposited over first insulated comb-like structure 102' and into spaces 92' between spaced insulated metallic elements 82' of array 90' to produce the structure shown in FIG. 10 wherein the deposited conducting material is depicted as substantially continuous layer 100. The conducting material need not necessarily form a continuous layer, as the objective of this step is particularly to fill spaces 92' with the conducting material. This step may be accomplished by sputtering or electron beam deposition.

Next, the segments of layer 110 above insulated elements 82' are preferentially removed to form a second spaced array of linear metallic elements 112 substantially juxtaposed, i.e., in a substantially side-by-side relationship, from insulated lamellae 82' as shown in FIG. 11. This step is preferably accomplished by plasma (dry) etching or by electropolishing means.

Next, layer 116 of a masking material is selectively applied over top surface 114 of the interdigitated arrays of insulated metallic elements 82' and elements 112 to prevent adherence of metal to surface 114 during the next step.

Then, spaced elements 112 are interconnected by means of a second metallic stripe, bus or interconnect made by conventional photomasking, wet or dry etching and metallic deposition techniques, to form a second comb-like structure, interdigitated with and electrically insulated from the first comb-like structure.

The final typical interdigitated comb-like structure is shown in FIG. 12 after removal of the masking material over surfaces 108 and 114 and any metal deposited thereon. In FIG. 12, first comb-like structure 102 consists of insulated bus or interconnect 100' to which are electrically connected insulated metallic elements 82'. Interdigitated with and electrically insulated from first comb-like structure 102 is second comb-like structure 120 consisting of interconnect 118 to which metallic elements 112 are electrically connected.

In FIG. 12 there is shown the interdigitated or intermeshed comb-like structure common to all surface acoustic wave devices. It will be appreciated that the structure of FIG. 12 is representative and that other variations may readily be achieved, given the teachings therein. One such contemplated SAW device structure, for example, is an apodized structure where the elements extending from busses 100 and 118 are separated by a gap into active elements attached to the busses and dummy elements and where the locus of the gap measured from the bus varies in periodic fashion along the length of the bus. Thus, it will be understood by those skilled in the art that various changes in form and detail may be made in the invention without departing from the true spirit and scope of the invention as defined by the appended claims.

What is claimed is:

1. In a surface acoustic wave device having at least two transducers situated on the surface of a body of single crystal piezoelectric material, each transducer comprising a first comb-like structure interdigitated with and electrically insulated from a second comb-like structure, each said comb-like structure comprising a spaced array of linear metallic elements electrically interconnected at one end by means of a metallic interconnect, the improvement which comprises as the metallic elements of one of the spaced arrays the metallic phase of composition substantially corresponding to one of the phases of a metallic eutectic alloy system and the widths of the metallic elements of arrays being less than 0.33 micron.

2. The improvement substantially as recited in claim 1 wherein said eutectic alloy system is one selected from the group consisting of the lead-tin, lead-cadmium, aluminum-copper, chrome-silicon, and molybdenum-silicon systems.

3. The improvement substantially as recited in claim 1 wherein the widths of the spaces in-between said metallic elements are less than about 0.33 micron.

4. A surface acoustic wave device comprising (a) a body of piezoelectric material, said body having substantially parallel major surfaces and a peripheral edge area interconnecting said major surfaces;
(b) a thin film lamellar metallic eutectic on at least a portion of one of said major surfaces of said body;
(c) one of the phases of said thin film lamellar metallic eutectic being removed to form a first spaced array of substantially parallel metallic elements;
(d) a first interconnect electrically connecting said metallic elements of said first spaced array, to form a first comb-like structure;
(e) a layer of an insulating material over the exposed surfaces of said first comb-like structure;
(f) a conducting material in the spaces between the insulated elements of said first spaced array forming a second spaced array of metallic elements substantially juxtaposed from said insulated metallic elements of said first spaced array;
(g) a second interconnect electrically connecting said metallic elements of said second spaced array, forming a second comb-like structure interdigitated with said first comb-like structure and electrically insulated from said first comb-like structure; and
(h) the lateral spacing of the metallic elements of said first spaced array being less than about 0.33 microns.

5. A surface acoustic wave device comprising (a) a body of piezoelectric material, said body having substantially parallel major surfaces and a peripheral edge area interconnecting said major surfaces;
(b) a thin film lamellar metallic eutectic on at least a portion of one of said major surfaces of said body;
(c) one of the phases of said thin film lamellar metallic eutectic forming a first spaced array of substantially parallel metallic elements;
(d) a first interconnect to electrically connect said metallic elements of said first spaced array and forming a first comb-like structure;
(e) a layer of an insulating material over the exposed surfaces of said first comb-like structure;
(f) the top surface of said first interconnect being masked;
(g) a substantially continuous layer of a conducting material over the insulated first comb-like structure and filling the spaces between the insulated elements of said first spaced array;
(h) segments of the deposited conducting material being absent from above the insulated metallic elements of said first spaced array to form a second spaced array of metallic elements substantially juxtaposed from said insulated metallic elements of said first spaced array;
(i) the top surface of said first and second spaced arrays being masked;
(j) a second interconnect to electrically connect said metallic elements of said second spaced array, and forming a second comb-like structure interdigitated with and electrically insulated from said first comb-like structure;
(k) the masking material and metal deposited thereon being removed from the top surface of said first interconnect and from the top surface of the first and second spaced arrays, and
(l) the lateral spacing of the first spaced array of substantially parallel metallic elements being less than about 0.33 microns.

* * * * *